(12) United States Patent
Jiang et al.

(10) Patent No.: US 11,705,340 B2
(45) Date of Patent: Jul. 18, 2023

(54) PIT-LESS CHEMICAL MECHANICAL PLANARIZATION PROCESS AND DEVICE STRUCTURES MADE THEREFROM

(71) Applicant: Taiwan Semiconductor Manufacturing Company Limited, Hsinchu (TW)

(72) Inventors: Jheng-Hong Jiang, Hsinchu (TW); Shing-Huang Wu, Hsinchu (TW); Chia-Wei Liu, Zhubei (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 169 days.

(21) Appl. No.: 17/218,471

(22) Filed: Mar. 31, 2021

(65) Prior Publication Data

US 2022/0319864 A1    Oct. 6, 2022

(51) Int. Cl.
| | |
|---|---|
| H01L 21/321 | (2006.01) |
| H01L 23/522 | (2006.01) |
| H01L 23/532 | (2006.01) |
| C22C 21/12 | (2006.01) |
| H01L 21/768 | (2006.01) |

(52) U.S. Cl.
CPC .......... *H01L 21/3212* (2013.01); *C22C 21/12* (2013.01); *H01L 21/7684* (2013.01); *H01L 21/76802* (2013.01); *H01L 21/76843* (2013.01); *H01L 21/76877* (2013.01); *H01L 23/5226* (2013.01); *H01L 23/53219* (2013.01); *H01L 23/53223* (2013.01)

(58) Field of Classification Search
CPC .......... H01L 21/3212; H01L 21/76802; H01L 21/7684; H01L 21/76843; H01L 21/76877; H01L 23/5226; H01L 23/53219; H01L 23/53223; C22C 21/12
See application file for complete search history.

(56) References Cited

U.S. PATENT DOCUMENTS

| | | | | |
|---|---|---|---|---|
| 11,430,778 | B2* | 8/2022 | Lee | H01L 21/76877 |
| 2008/0012142 | A1* | 1/2008 | Mehta | H01L 23/53295 |
| | | | | 257/762 |
| 2018/0204800 | A1* | 7/2018 | Adusumilli | H01L 21/76877 |
| 2020/0286780 | A1* | 9/2020 | Li | H01L 21/76883 |
| 2021/0407902 | A1* | 12/2021 | Chouksey | H01L 29/78696 |

* cited by examiner

*Primary Examiner* — Karen Kusumakar
(74) *Attorney, Agent, or Firm* — The Marbury Law Group, PLLC

(57) ABSTRACT

A cavity may be formed in a dielectric material layer overlying a substrate. A layer stack including a metallic barrier liner, a metallic fill material layer, and a metallic capping material may be deposited in the cavity and over the dielectric material layer. Portions of the layer stack located above a horizontal plane including a top surface of the dielectric material layer may be removed. A contiguous set of remaining material portions of the layer stack includes a metal interconnect structure that is free of a pitted surface.

20 Claims, 15 Drawing Sheets

PIT-LESS CHEMICAL MECHANICAL PLANARIZATION PROCESS AND DEVICE STRUCTURES MADE THEREFROM

BACKGROUND

Chemical mechanical polishing processes are used to provide a planarization process during semiconductor manufacturing. Precise control of a polishing thickness and uniformity of the polish rate across a wafer are desired to provide a polished film having a uniform thickness distribution.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
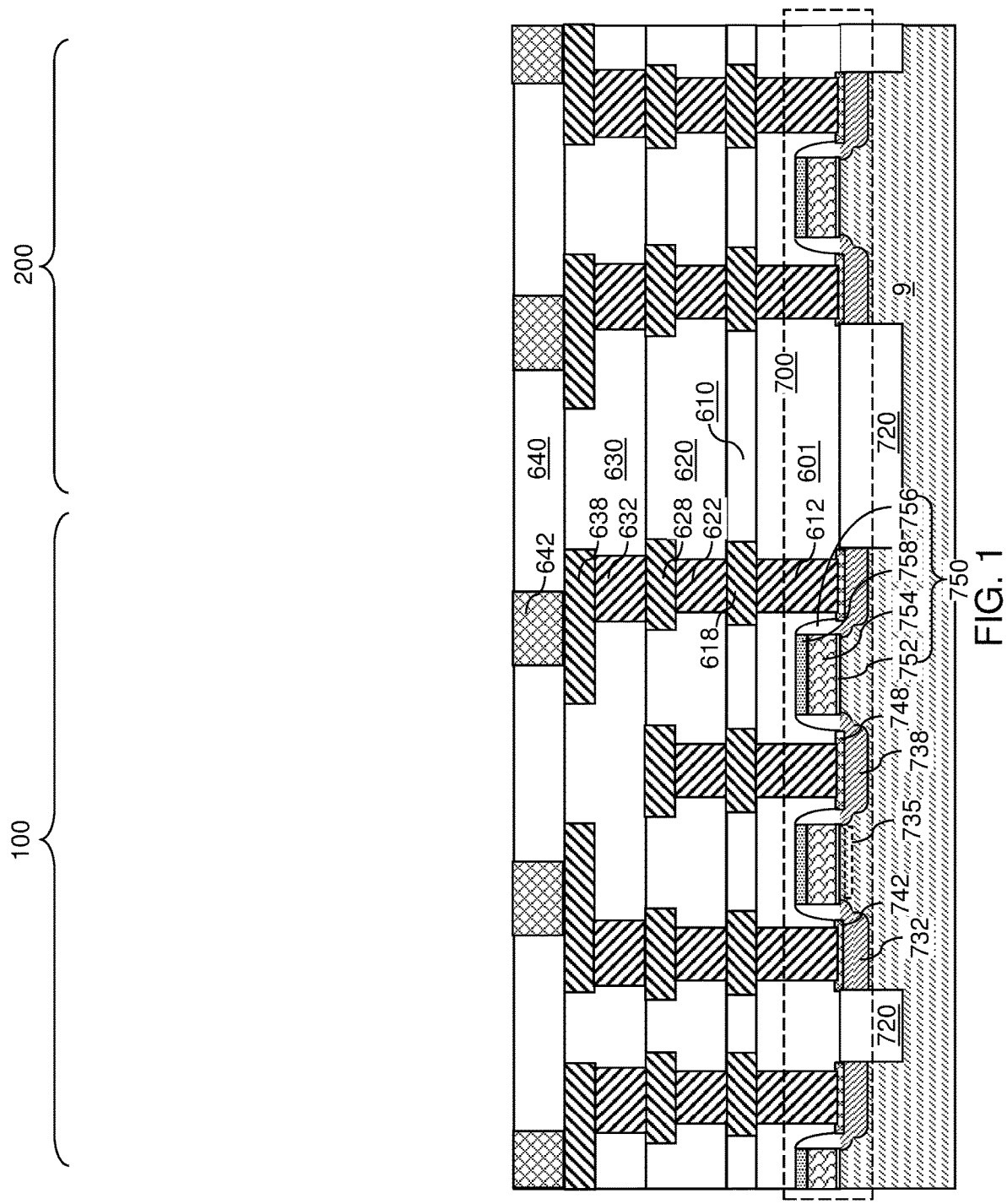
FIG. 1 is a vertical cross-sectional view of an exemplary structure after formation of complementary metal oxide-semiconductor (CMOS) transistors, metal interconnect structures embedded in dielectric material layers, and a connection-via-level dielectric layer according to an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Generally, metal interconnect structures such as metal pads may be formed by forming recess cavities in a dielectric material layer, by depositing a metallic material in the recess cavities, and by performing a planarization process in which excess portions of the metallic material may be removed from above the horizontal plane including the top surface of the dielectric material layer. Deposition of the metallic material is typically performed using a physical vapor deposition process, which is a highly effective deposition process that may provide a high deposition rate. The physical vapor deposition process is an anisotropic deposition process. As such, the deposited metallic material may have a contoured top surface in proximity to each top periphery of the recess cavities. Particularly, the top surface of the deposited metallic material may have a seam profile in which seams are formed at peripheral portions of a recessed portion of the contoured top surface of the deposited aluminum based material within the area of the recess cavities. Such seams trap slurries during a chemical mechanical polishing (CMP) process, and upon removal of the slurries after the CMP process, provides local pits on the surfaces of metal interconnect structures, which may be remaining portions of the deposited metallic material.

According to an aspect of the present disclosure, formation of such local pits may be prevented through use of a dual metallic material deposition process. Specifically, after deposition of a metallic material in the formed recess cavities, a metallic capping material may be deposited over the metallic material. The metallic capping material may have a greater hardness than the metallic material, and may provide higher polishing resistance during the CMP process. The metallic capping material may be aluminum-based, or may comprise a conductive metallic nitride material, or may comprise tungsten or titanium, and may, or may not, be present in the remaining portions of the deposited metallic materials. By eliminating formation of local pits on the surfaces of metal interconnect structures, the structures and methods of the various embodiments disclosed herein may provide metal interconnect structures having higher reliability and durability. The various embodiment methods and structures are now described with reference to accompanying figures.

FIG. 1 is a vertical cross-sectional view of an exemplary structure after formation of complementary metal oxide-semiconductor (CMOS) transistors, metal interconnect structures formed within dielectric material layers, and a connection-via-level dielectric layer according to embodiments of the present disclosure. The exemplary structure may include complementary metal oxide-semiconductor (CMOS) transistors and metal interconnect structures formed in dielectric material layers. Specifically, the exemplary structure may include a substrate 9. The substrate 9 may be a semiconductor substrate such as a commercially available silicon wafer. Shallow trench isolation structures 720 including a dielectric material such as silicon oxide may be formed in an upper portion of the substrate 9. Suitable doped semiconductor wells, such as p-type wells and n-type wells, may be formed within each area that may be laterally enclosed by a portion of the shallow trench isolation structures 720. Field effect transistors may be formed over the top surface of the substrate 9. For example, each field effect transistor may include a source region 732, a drain region 738, a semiconductor channel 735 that includes a surface portion of the substrate 9 extending between the source region 732 and the drain region 738, and a gate structure 750. Each gate structure 750 may include a gate dielectric 752, a gate electrode 754, a gate cap dielectric 758, and a dielectric gate spacer 756. A source-side metal semiconductor alloy region 742 may be formed on each source region 732, and a drain-side metal semiconductor alloy region 748 may be formed on each drain region 738. While planar field effect transistors are illustrated in the drawings, embodiments are expressly contemplated herein in which the field effect transistors may additionally or alternatively include fin field effect transistors (FinFET), gate-all-around field effect (GAA FET) transistors, or any other type of field effect transistors (FETs).

The exemplary structure illustrated in FIG. 1 may include a memory array region 100 in which an array of memory elements may be subsequently formed (e.g., back-end-of-line (BEOL) devices and elements), and a peripheral region 200 in which logic devices that support operation of the array of memory elements may be formed. In one embodiment, devices (such as field effect transistors) in the memory array region 100 may include bottom electrode access transistors that provide access to bottom electrodes of memory cells to be subsequently formed. Top electrode access transistors that provide access to top electrodes of memory cells to be subsequently formed may be formed in the peripheral region 200 at this processing step. Devices (such as field effect transistors) in the peripheral region 200 may provide functions that may be needed to operate the array of memory cells to be subsequently formed. Specifically, devices in the peripheral region 200 may be configured to control the programming operation, the erase operation, and the sensing (read) operation of the array of memory cells. For example, the devices in the peripheral region 200 may include a sensing circuitry and/or a top electrode bias circuitry. The devices formed on the top surface of the substrate 9 may include complementary metal oxide-semiconductor (CMOS) transistors and optionally additional semiconductor devices (such as resistors, diodes, capacitors, etc.), and are collectively referred to as CMOS circuitry 700.

Various metal interconnect structures formed within dielectric material layers may be subsequently formed over the substrate 9 and the devices (such as field effect transistors). The dielectric material layers may include, for example, a contact-level dielectric material layer 601, a first metal line-level dielectric material layer 610, a second line-and-via-level dielectric material layer 620, and a third line-and-via-level dielectric material layer 630. The metal interconnect structures may include device contact via structures 612 formed in the contact-level dielectric material layer 601 and contact a respective component of the CMOS circuitry 700, first metal line structures 618 formed in the first metal line-level dielectric material layer 610, first metal via structures 622 formed in a lower portion of the second line-and-via-level dielectric material layer 620, second metal line structures 628 formed in an upper portion of the second line-and-via-level dielectric material layer 620, second metal via structures 632 formed in a lower portion of the third line-and-via-level dielectric material layer 630, and third metal line structures 638 formed in an upper portion of the third line-and-via-level dielectric material layer 630.

Each of the dielectric material layers (601, 610, 620, 630) may include a dielectric material such as undoped silicate glass, a doped silicate glass, organosilicate glass, amorphous fluorinated carbon, porous variants thereof, or combinations thereof. Each of the metal interconnect structures (612, 618, 622, 628, 632, 638) may include at least one conductive material, which may be a combination of a metallic liner layer (such as a metallic nitride or a metallic carbide) and a metallic fill material. Each metallic liner layer may include TiN, TaN, WN, TiC, TaC, and WC, and each metallic fill material portion may include W, Cu, Co, Ru, Mo, Ta, Ti, alloys thereof, and/or combinations thereof. Other suitable metallic liner and metallic fill materials may be within the contemplated scope of disclosure. In one embodiment, the first metal via structures 622 and the second metal line structures 628 may be formed as integrated line and via structures by a dual damascene process, and/or the second metal via structures 632 and the third metal line structures 638 may be formed as integrated line and via structures.

In one embodiment, the metallic fill material portions of the metal interconnect structures (612, 618, 622, 628, 632, 638) may be based on a metallic element other than aluminum. In one embodiment, the metallic fill material portions of the metal interconnect structures (612, 618, 622, 628, 632, 638) may be copper-based. In this embodiment, the metallic fill material portions of the metal interconnect structures (612, 618, 622, 628, 632, 638) may include copper at an atomic percentage greater than 50%, which may be greater than 90% and/or may be greater than 98%. Generally, a set of metal interconnect structures (612, 618, 622, 628, 632, 638) embedded in dielectric material layers (601, 610, 620, 630) may be formed. The set of metal interconnect structures (612, 618, 622, 628, 632, 638) may be based on a metal other than aluminum. In one embodiment, the set of metal interconnect structures (612, 618, 622, 628, 632, 638) may be transition-metal based, i.e., based on a transition metal and may include the transition metal at an atomic percentage greater than 50%, such as greater than 90% and/or greater than 98%. For example, the set of metal interconnect structures (612, 618, 622, 628, 632, 638) may be copper-based. While the present disclosure is described using an embodiment in which three line-levels are present within transition-metal based metal interconnect structures (612, 618, 622, 628, 632, 638), embodiments are expressly contemplated herein in which a lesser number or a greater number of metal interconnect structures (612, 618, 622, 628, 632, 638) may be formed prior to formation of metal interconnect structures.

According to an aspect of the present disclosure, a dielectric material layer may be formed over the transition-metal based metal interconnect structures (612, 618, 622, 628, 632, 638). Metal interconnect structures 642 may be subsequently formed in the dielectric material layer, and thus, the dielectric material layer is herein referred to as a metallic-stack-based-interconnect-level dielectric material layer 640. The metallic-stack-based-interconnect-level dielectric material layer 640 may include a dielectric material such as undoped silicate glass or a doped silicate glass, and may have a thickness in a range from 200 nm to 2,000 nm, such as from 400 nm to 1,000 nm, although lesser and greater thicknesses may also be used. The metallic-stack-based-interconnect-level dielectric material layer 640 may be deposited, for example, by chemical vapor deposition.

The metal interconnect structures 642 may be formed using a set of processing steps that are subsequently described. The metal interconnect structures 642 may include metal via structures, metal line structures, metal pad structures, and/or integrated metal line-and-via structures. While the present disclosure is described using an embodiment in which the metal interconnect structures 642 may be formed as metal pad structures, embodiments are expressly contemplated herein in which the metal interconnect structures 642 may be formed as metal via structures, metal line structures, and/or integrated metal line-and-via structures.

Figure 2A:
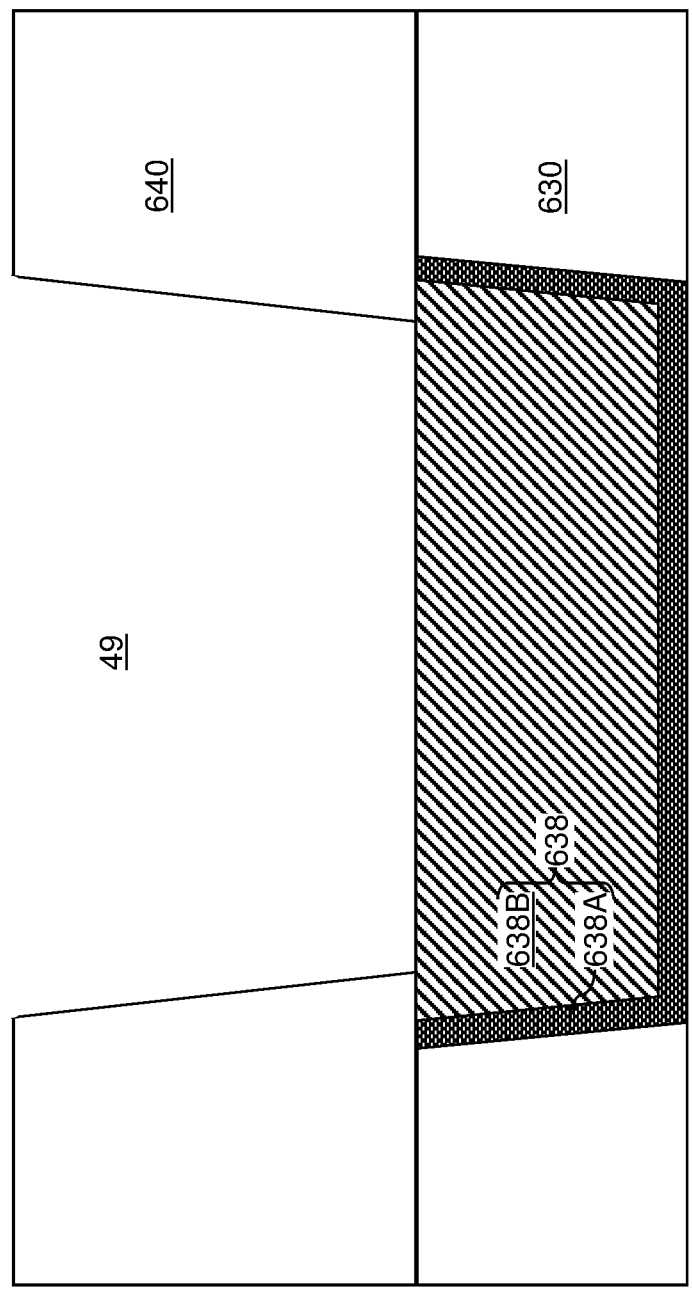
FIGS. 2A-2C are sequential vertical cross-sectional views of a portion of the exemplary structure during formation of a metal interconnect structure in a first configuration according to an embodiment of the present disclosure.
Figure 2B:
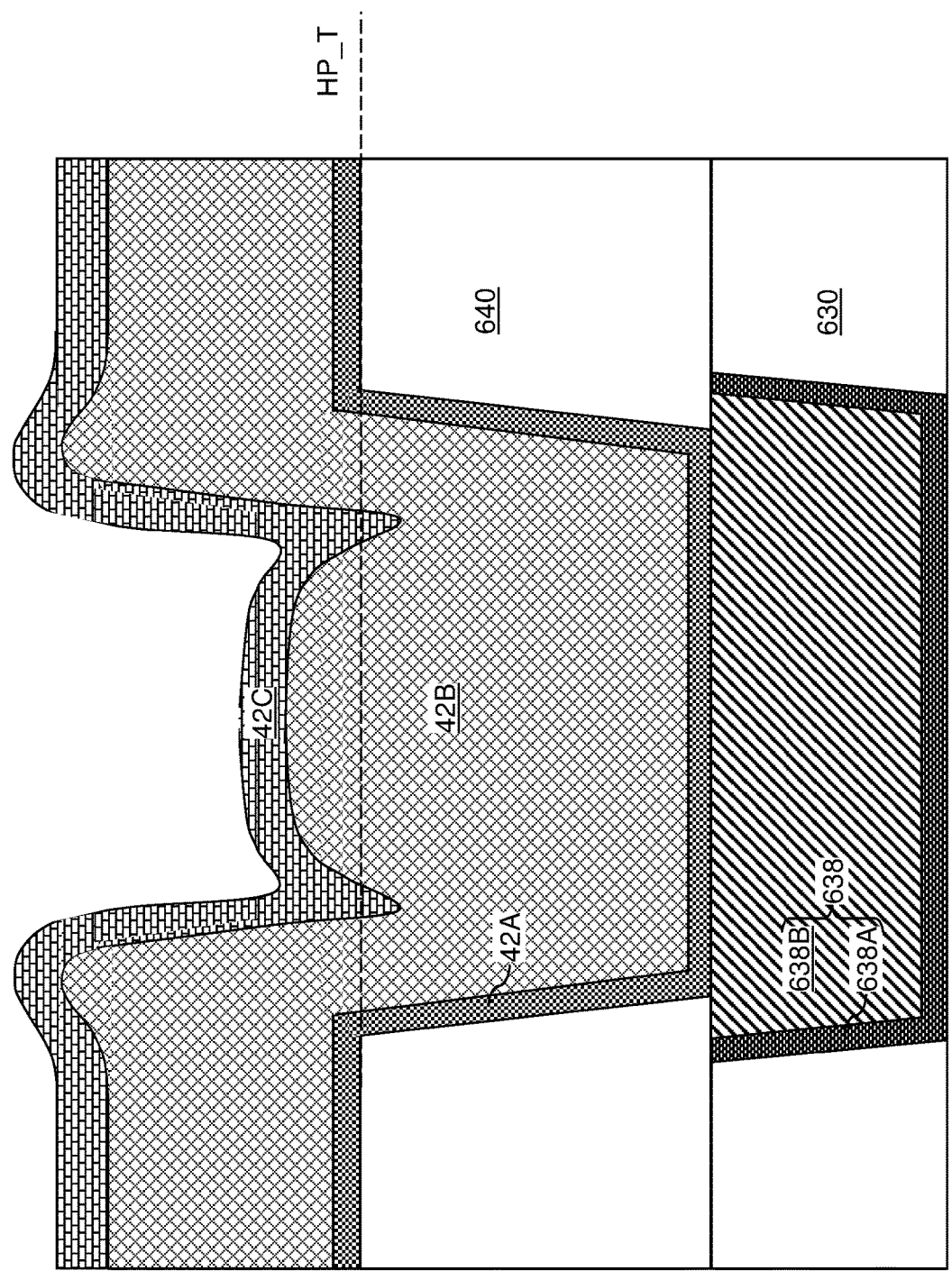
Figure 2C:
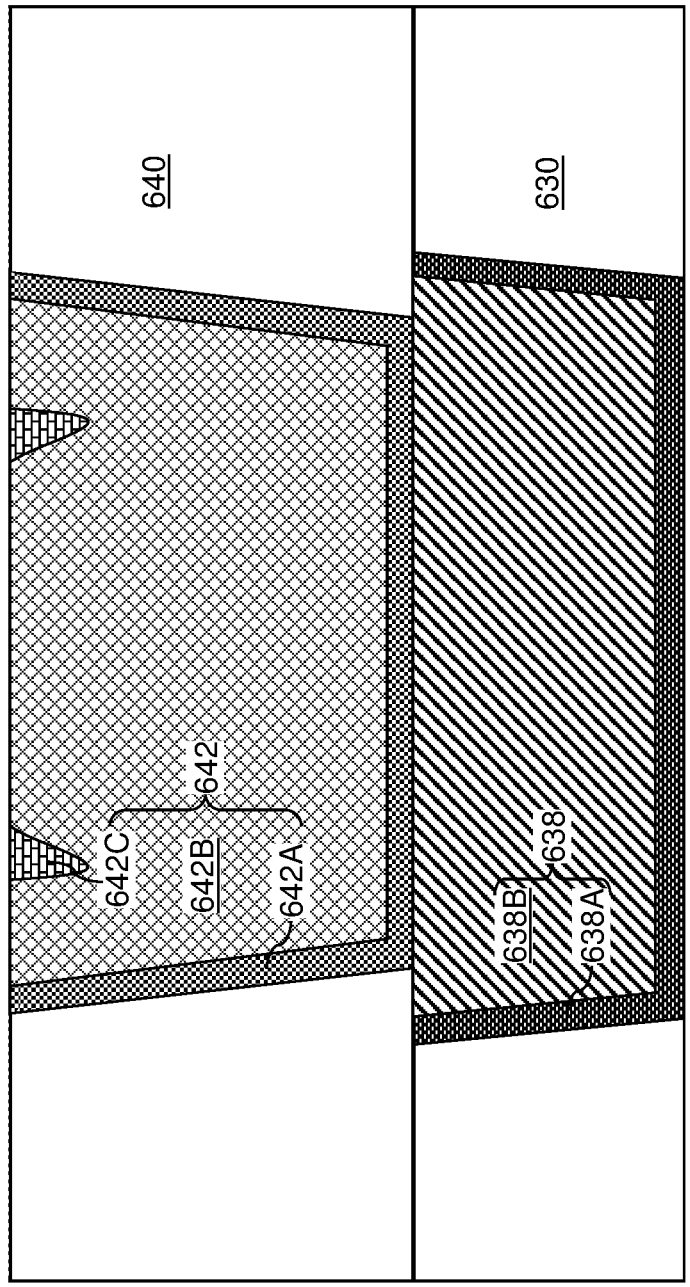

FIGS. 2A-2C are sequential vertical cross-sectional views of a portion of the exemplary structure during formation of a metal interconnect structure in a first configuration according to an embodiment of the present disclosure.

Referring to FIG. 2A, a portion of the exemplary structure is illustrated after formation of a cavity 49 through the metallic-stack-based-interconnect-level dielectric material layer 640. The cavity 49 may be formed, for example, by applying a photoresist layer (not shown) over the metallic-stack-based-interconnect-level dielectric material layer 640, lithographically patterning the photoresist layer to form openings therethrough such that the openings overlie a respective one of the underlying transition-metal based metal interconnect structures (612, 618, 622, 628, 632, 638) such as third metal line structures 638, and transferring the pattern of the openings in the photoresist layer through the metallic-stack-based-interconnect-level dielectric material layer 640 by performing an anisotropic etch process such as a reactive ion etch process until a top surface of a respective one of the transition-metal based metal interconnect structures (612, 618, 622, 628, 632, 638) may be physically exposed. The photoresist layer may be subsequently removed, for example, by ashing.

In one embodiment, the transition-metal based metal interconnect structures (612, 618, 622, 628, 632, 638) may comprise copper-based metal interconnect structures. For example, a metal interconnect structure that is physically exposed underneath the cavity 49 (such as a third metal line structure 638) may comprise a combination of a metallic barrier liner 638A and a copper-based metallic fill material portion 638B embedded in the metallic barrier liner 638A. The metallic barrier liner 638A is also referred to as a copper-interconnect-level metallic barrier liner 638A. The metallic barrier liner 638A may have a thickness in a range from 5 nm to 100 nm, such as from 10 nm to 50 nm, although lesser and greater thicknesses may also be used. The copper-based metallic fill material portion 638B may comprises copper at an atomic percentage greater than 50%, and/or greater than 90%, and/or greater than 98%.

The cavity 49 may include sidewalls that vertically extend from a top surface of the metallic-stack-based-interconnect-level dielectric material layer 640 to a top surface of an underlying transition-metal based metal interconnect structure (612, 618, 622, 628, 632, 638), which may be a copper-based metal interconnect structure.

Referring to FIG. 2B, a layer stack may be deposited, which includes, from bottom to top, a metallic barrier liner layer 42A, and a metallic fill material layer 42B. The metallic fill material layer 42B may comprise aluminum at a first atomic percentage greater than 90% and may have a first Young's modulus. The layer stack may further comprise a metallic capping material layer 42C. The metallic capping material layer 42C may comprise a metallic material having second Young's modulus that is greater than the first Young's modulus may be deposited as in the cavities 49 and over the metallic-stack-based-interconnect-level dielectric material layer 640.

The metallic barrier liner layer 42A includes a conductive metallic barrier material such as TiN, TaN, WN, TiC, TaC, WC, W, or Ti The metallic barrier liner layer 42A is also referred to as an aluminum-interconnect-level metallic barrier liner. The metallic barrier liner layer 42A may be deposited by physical vapor deposition or chemical vapor deposition. The thickness of the metallic barrier liner layer 42A may be in a range from 5 nm to 100 nm, such as from 10 nm to 50 nm, although lesser and greater thicknesses may also be used.

The metallic fill material layer 42B includes a metallic material having a first Young's modulus. Generally, the metallic fill material layer 42B may include an aluminum-based material, a copper-based material, or a tungsten-based material. In one embodiment, the metallic fill material layer 42B may be an aluminum-based metallic fill material layer that includes aluminum at the first atomic percentage, which may be in a range from 90% to 100%. In one embodiment, the first atomic percentage may be in a range from 95% to 99.99%, such as from 98% to 99.9% and/or rom 99.0% to 99.8%. In one embodiment, the metallic fill material layer metallic fill material layer 42B may consist essentially of aluminum. Alternatively, the metallic fill material layer metallic fill material layer 42B may include an aluminum alloy containing aluminum and at least one additional element other than aluminum. For example, the at least one additional element may include at least one of Cu, Mn, Si, Mg, Zn, B, Ti, Cr, Fe, Co, Ni, Mo, Ag, Ta, W, Re, Ir, Pt, and Au. Addition of the at least one additional element may increase mechanical strength (as measured by Young's modulus), uniformity of chemical composition, thermal stability, and/or electromigration resistance. Alternatively, the metallic fill material layer 42B may include a copper-based material including copper at an atomic percentage greater than 50%, or may include a tungsten-based material including tungsten at an atomic percentage greater than 50%.

The metallic fill material layer 42B may be deposited by performing a first physical vapor deposition process. The duration of the first physical vapor deposition process that deposits the metallic fill material layer 42B may be selected such that the lowest regions of the top surface of the metallic fill material layer 42B are formed below the horizontal plane HP_T including the top surface of the metallic-stack-based-interconnect-level dielectric material layer 640, while a region of the top surface of the metallic fill material layer 42B that overlies a center region of the cavity 49 is formed above the horizontal plane HP_T including the top surface of the metallic-stack-based-interconnect-level dielectric material layer 640.

In one embodiment, the metallic material of the metallic capping material layer 42C comprises, and/or consists essentially of, an aluminum-containing alloy including aluminum at a second atomic percentage that is less than the first atomic percentage, and including at least one non-aluminum element at an atomic percentage greater than 0.1%. The second atomic percentage may be in a range from 80% to 99.9%. In one embodiment, the second atomic percentage may be in a range from 90% to 99.9%, such as from 95% to 99.8% and/or rom 98.0% to 99.5%. The metallic capping material layer 42C may comprise at least one additional element other than aluminum. For example, the at least one non-aluminum element may include at least one of Cu, Mn, Si, Mg, Zn, B, Ti, Cr, Fe, Co, Ni, Mo, Ag, Ta, W, Re, Ir, Pt, and Au. Other suitable non-aluminum elements are within the contemplated scope of disclosure. The at least one non-aluminum element within the metallic capping material layer 42C may increase mechanical strength (as measured by Young's modulus), uniformity of chemical composition, thermal stability, and/or electromigration resistance. Particularly, the at least one non-aluminum element may be selected such that the second Young's modulus of the material of the metallic capping material layer 42C is greater than the first Young's modulus of the material of the metallic fill material layer 42B at least by 1%, such as by more than 5% and/or by more than 10% and/or by more than 20%. The increase in Young's modulus generally correlates with resistance to formation of pits during a chemical mechanical polishing process, and reduces trapping of slurry in pits. Alternatively, the metallic capping material layer 42C may be free of aluminum. In this embodiment, the metallic capping material layer 42C may comprise, and/or may consist essentially of, TiN, TaN, WN, Ti, Ta, or W.

In some embodiments, the metallic fill material layer 42B may include a copper-based material including copper at an atomic percentage greater than 50% or a tungsten-based material including tungsten at an atomic percentage greater than 50%, the material of the metallic capping material layer 42C can be selected such that the second Young's modulus of the material of the metallic capping material layer 42C is greater than the first Young's modulus of the material of the metallic fill material layer 42B at least by 1%, such as by more than 5% and/or by more than 10% and/or by more than 20%. In one embodiment, the metallic capping material layer 42C may comprise, and/or may consist essentially of, TiN, TaN, WN, Ti, Ta, or W.

The metallic capping material layer 42C may be deposited by performing a second physical vapor deposition process. The duration of the second physical vapor deposition process that deposits the metallic capping material layer 42C may be selected such that the entirety of the top surface of the metallic capping material layer 42C is formed above the horizontal plane including the top surface of the metallic capping material layer 42C. In one embodiment, the deposition process for depositing the metallic fill material layer 42B and the deposition process for depositing the metallic capping material layer 42C may be performed in a same process chamber. In one embodiment, the two deposition processes for depositing the metallic fill material layer 42B and the metallic capping material layer 42C may be merged into a single deposition process including two different deposition steps in which the material composition of the deposited material changes abruptly or gradually provided that the compositional change between the metallic fill material layer 42B and the metallic capping material layer 42C provides sufficient change in Young's modulus as described above.

Figure 2D:
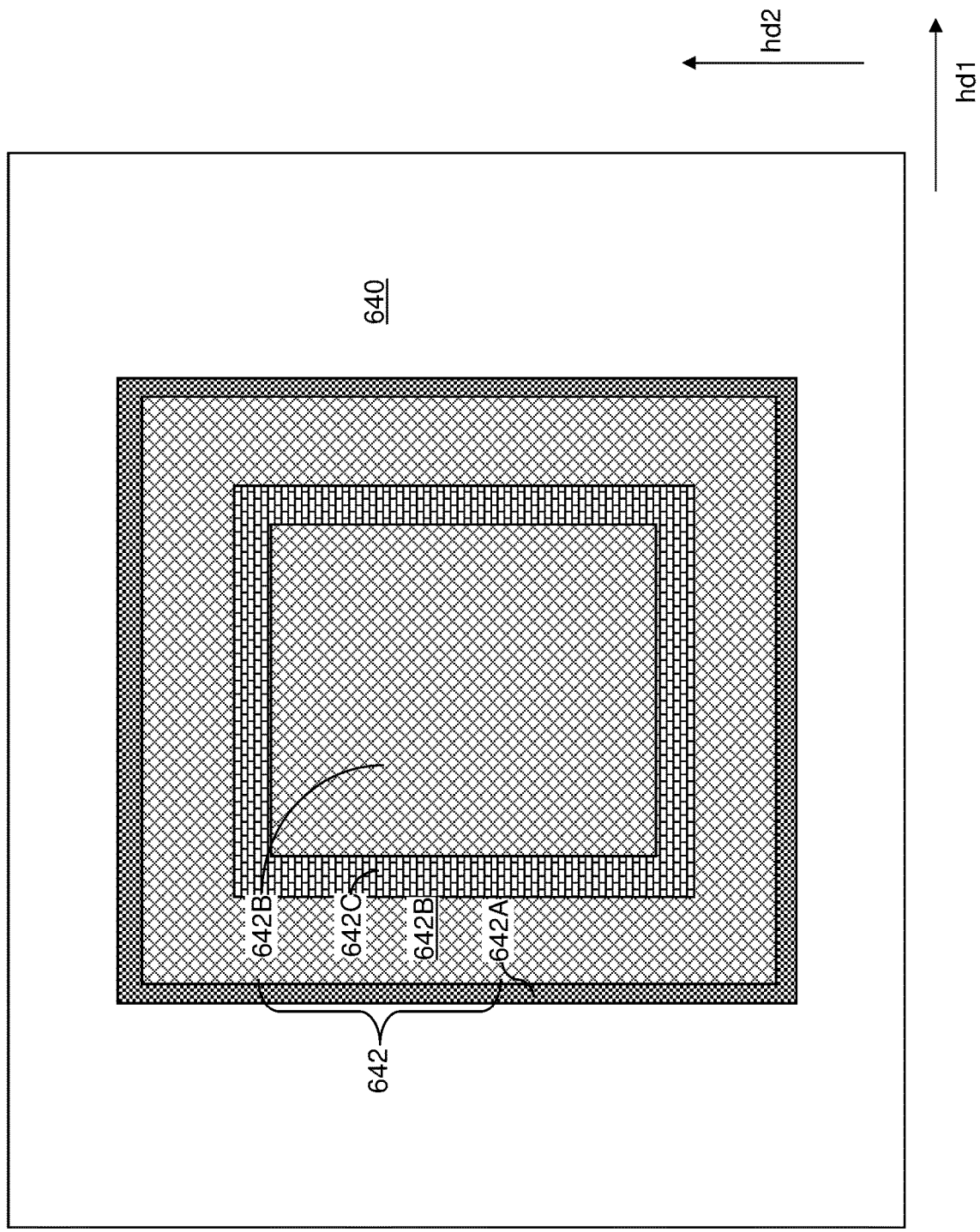
FIG. 2D is a top-down view of the portion of the exemplary structure illustrated in FIG. 2C.

FIG. 2D is a top-down view of the portion of the exemplary structure illustrated in FIG. 2C. In one embodiment, ratio of the area of the top surface of the metallic capping material layer 42C to the area of the top surface of the metal interconnect structure 642 may be in a range from 0.01 to 0.3, such as from 0.02 to 0.2 and/or from 0.03 to 0.1.

Referring to FIGS. 2C and 2D, portions of the layer stack (42A, 42B, 42C) located above the horizontal plane including the top surface of the metallic-stack-based-interconnect-level dielectric material layer 640 may be removed by performing a chemical mechanical polishing process. According to an aspect of the present disclosure, the material of the metallic capping material layer 42C provides greater polishing resistance (i.e., a lower polish rate) than the material of the metallic fill material layer 42B. Thus, portions of the metallic capping material layer 42C located underneath the horizontal plane including the top surface of the metallic-stack-based-interconnect-level dielectric material layer 640 remain embedded within a respective remaining portion of the metallic fill material layer 42B. Each contiguous set of remaining material portions of the layer stack (42A, 42B, 42C) comprises a metal interconnect structure 642.

Each metal interconnect structure 642 may comprise a metallic barrier liner 642A, a metallic fill material portion 642B, and a metallic inlay structure 642C. The metallic barrier liner 642A is a patterned remaining portion of the metallic barrier liner layer 42A. The metallic fill material portion 642B is a patterned remaining portion of the metallic fill material layer 42B. The metallic inlay structure 642C is a patterned remaining portion of the metallic capping material layer 42C. The metallic inlayer structure 642C may be embedded within the metallic fill material portion 642B, which is a remaining portion of the metallic fill material layer 42B.

The topmost surfaces of the metallic barrier liner 642A, the metallic fill material portion 642B, and the metallic inlay structure 642C may be formed within the horizontal plane including the top surface of the metallic-stack-based-interconnect-level dielectric material layer 640 (as shown in FIG. 2C). In one embodiment, the metallic fill material portion 642B may comprise a contoured top surface that includes an outer surface portion that is physically exposed outside a closed outer periphery of the metallic inlay structure 642C, an inner surface portion that is physically exposed inside a closed inner periphery of the metallic inlay structure 642C, and a contoured connecting surface portion that contacts a contoured bottom surface of the metallic inlay structure 642C and connecting the outer surface portion and the inner surface portion.

The outer periphery of the top surface, and/or a horizontal cross-sectional shape, of each metal interconnect structure 642 may have a shape of a square, a rounded square, a rectangle, a rounded rectangle, or any two-dimensional curvilinear shape having a closed periphery. In one embodiment, the outer periphery of the top surface, and/or a horizontal cross-sectional shape, of each metal interconnect structure 642 may have a pair of first sides that are parallel to a first horizontal direction hd1 and a pair of second sides that are parallel to a second horizontal direction hd2. The pair of first sides may, or may not, be directly adjoined to the pair of second sides. The lateral dimension of each first side may be in a range from 300 nm to 60,000 nm, such as from 1,000 nm to 10,000 nm, although lesser and greater lateral dimensions may also be used.

An inner periphery of a top surface of the metallic barrier liner 642A may be laterally offset inward from an outer periphery of the top surface of the metallic barrier liner 642A. An outer periphery of the outer surface portion of the top surface of the metallic fill material portion 642B may coincide with the inner periphery of the top surface of the metallic barrier liner 642A. An inner periphery of the outer surface portion of the top surface of the metallic fill material portion 642B may be laterally offset inward from the outer periphery of the outer surface portion of the top surface of the metallic fill material portion 642B. An outer periphery of the contoured connecting surface portion of the top surface of the metallic fill material portion 642B may coincide with the inner periphery of the outer surface portion of the top surface of the metallic fill material portion 642B. An inner periphery of the contoured connecting surface portion of the top surface of the metallic fill material portion 642B may be laterally offset inward from the outer periphery of the contoured connecting surface portion of the top surface of the metallic fill material portion 642B. A periphery of the inner surface portion of the top surface of the metallic fill material portion 642B may coincide with the inner periphery of the contoured connecting surface portion of the top surface of the metallic fill material portion 642B.

According to an embodiment of the present disclosure, a device structure is provided, which comprises: a dielectric material layer (such as a metallic-stack-based-interconnect-level dielectric material layer 640) located over a substrate 9; and a metal interconnect structure 642 formed within the dielectric material layer and comprising: a metallic barrier liner 642A comprising a conductive metallic material; a metallic fill material portion 642B located within the metallic barrier liner 642A and comprising aluminum at a first atomic percentage greater than 90%; and a metallic inlay structure 642C embedded within the metallic fill material portion 642B and comprising an aluminum-containing alloy including aluminum at a second atomic percentage that is less than the first atomic percentage and including a non-aluminum element at an atomic percentage greater than 0.1%, wherein the metallic inlay structure 642C has a top surface within a horizontal plane including topmost surfaces of the metallic barrier liner 642A and the metallic fill material portion 642B and is laterally spaced from an interface between the metallic barrier liner 642A and the metallic fill material portion 642B.

In one embodiment, the metallic fill material portion 642B comprises aluminum at the first atomic percentage, which may be greater than 90%. The metallic inlay structure 642C comprises, and/or consists essentially of, an aluminum-containing alloy including aluminum at the second atomic percentage that is less than the first atomic percentage. The metallic inlay structure 642C includes at least one non-aluminum element at an atomic percentage greater than 0.1%. The metallic inlay structure 642C has a top surface within a horizontal plane including topmost surfaces of the metallic barrier liner 642A and the metallic fill material portion 642B, and is laterally spaced from an interface between the metallic barrier liner 642A and the metallic fill material portion 642B.

In one embodiment, the metallic inlay structure 642C has a greater value for Young's modulus than the metallic fill material portion 642C, for example, by at least 1%, and/or by at least 5%, and/or by at least 10%, and/or by at least 20%. In one embodiment, the non-aluminum element comprises at least one element selected from Cu, Mn, Si, Mg, Zn, B, Ti, Cr, Fe, Co, Ni, Mo, Ag, Ta, W, Re, Ir, Pt, and Au.

In one embodiment, the metallic inlay structure 642C has a vertical cross-sectional profile in which a width of the metallic inlay structure 642C strictly decreases with a vertical distance downward from the horizontal plane including the topmost surfaces of the metallic barrier liner 642A and the metallic fill material portion 642B. As used herein, a "strict increase" (or "strictly increases") in a quantity as a function of a variable means that for each increase in the value of the variable, the value of the function increases. As used herein, a "strict decrease" (or "strictly decreases") in a quantity as a function of a variable means that for each increase in the value of the variable, the value of the function decreases. Thus, the width of the metallic inlay structure 642C decreases with each increase in the vertical distance downward from the horizontal plane including the topmost surfaces of the metallic barrier liner 642A and the metallic fill material portion 642B. The uniform spacing between the outer periphery of the top surface of the metallic inlay structure 642C and the inner periphery of the top surface of the metallic inlay structure 642 may be in a range from 2 nm to 200 nm, such as from 6 nm to 60 nm, although lesser and greater widths may also be used.

In one embodiment, the interface between the metallic barrier liner 642A and the metallic fill material portion 642B has a closed periphery within the horizontal plane including the topmost surfaces of the metallic barrier liner 642A and the metallic fill material portion 642B. The metallic inlay structure 642C comprises a closed outer periphery within the horizontal plane including the topmost surfaces of the metallic barrier liner 642A and the metallic fill material portion 642B.

In one embodiment, the device structure comprises: an additional dielectric material layer (such as a third line-and-via-level dielectric material layer 630) located between the substrate 9 and the dielectric material layer (such as a metallic-stack-based-interconnect-level dielectric material layer 640); and a copper-based metal interconnect structure (such as a third metal line structure 638) comprising an additional metallic barrier liner 638A and a copper-based metallic fill material portion 638B embedded in the additional metallic barrier liner 638A and contacting a bottom surface of the metallic barrier liner 642A, wherein the copper-based metallic fill material portion 638B comprises copper at an atomic percentage greater than 50%, such as greater than 90% and/or greater than 98%.

Each contiguous set of remaining material portions of the layer stack (42A, 42B, 42C) comprises a metal interconnect structure 642. Each metal interconnect structure 642 may comprise a metallic barrier liner 642A and a metallic fill material portion 642B. The metallic barrier liner 642A is a patterned remaining portion of the metallic barrier liner layer 42A. The metallic fill material portion 642B is a patterned remaining portion of the metallic fill material layer 42B. The topmost surfaces of the metallic barrier liner 642A and the metallic fill material portion 642B may be formed within the horizontal plane including the top surface of the metallic-stack-based-interconnect-level dielectric material layer 640. The top surface of the metallic fill material portion 642B may continuously extend without any opening therethrough inside an inner periphery of the metallic barrier liner 642A located within the horizontal plane including the top surface of the metal interconnect structure 642.

Figure 3A:
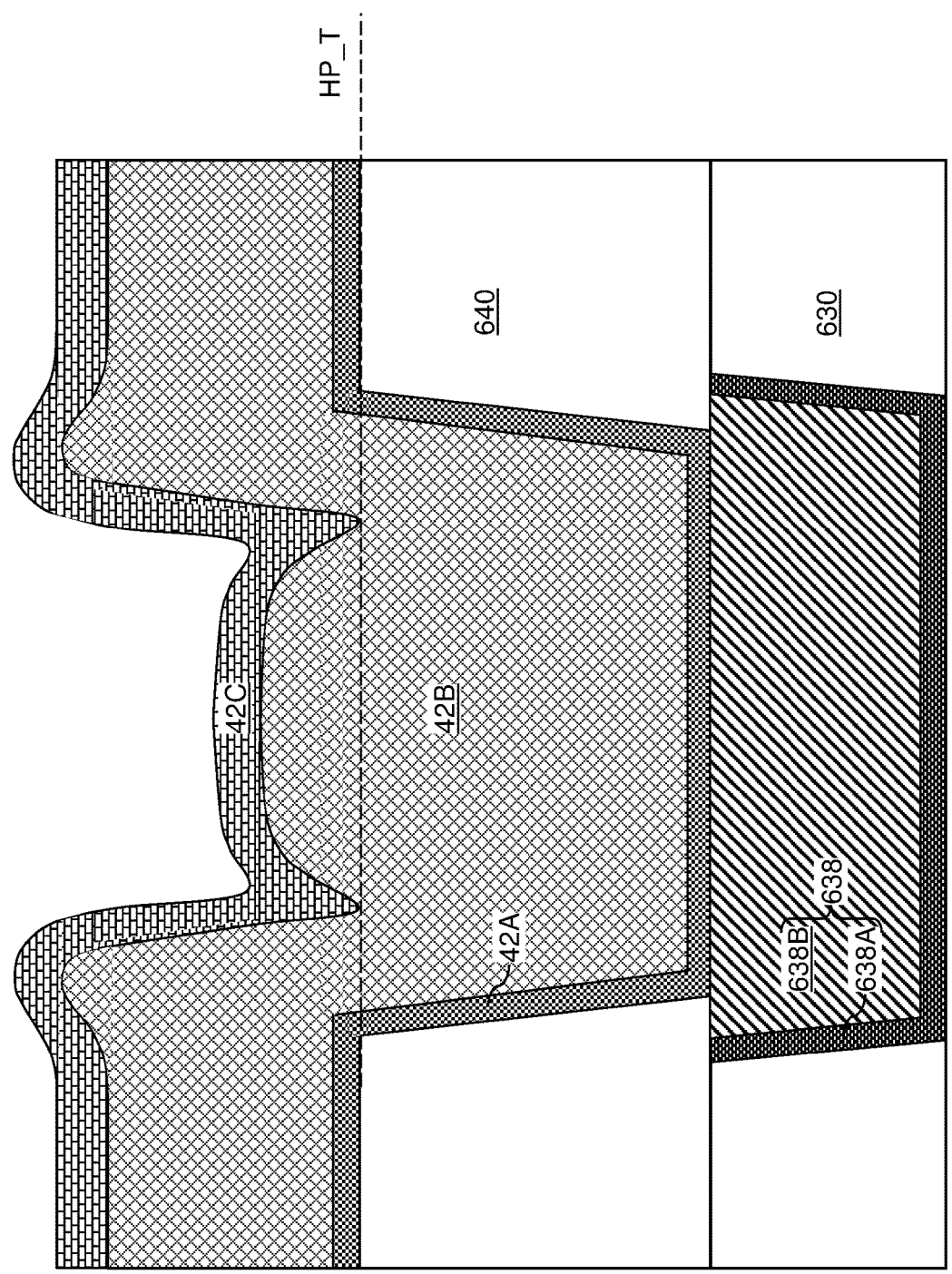
FIGS. 3A and 3B are sequential vertical cross-sectional views of a portion of the exemplary structure during formation of a metal interconnect structure in a second configuration according to an embodiment of the present disclosure.
Figure 3B:
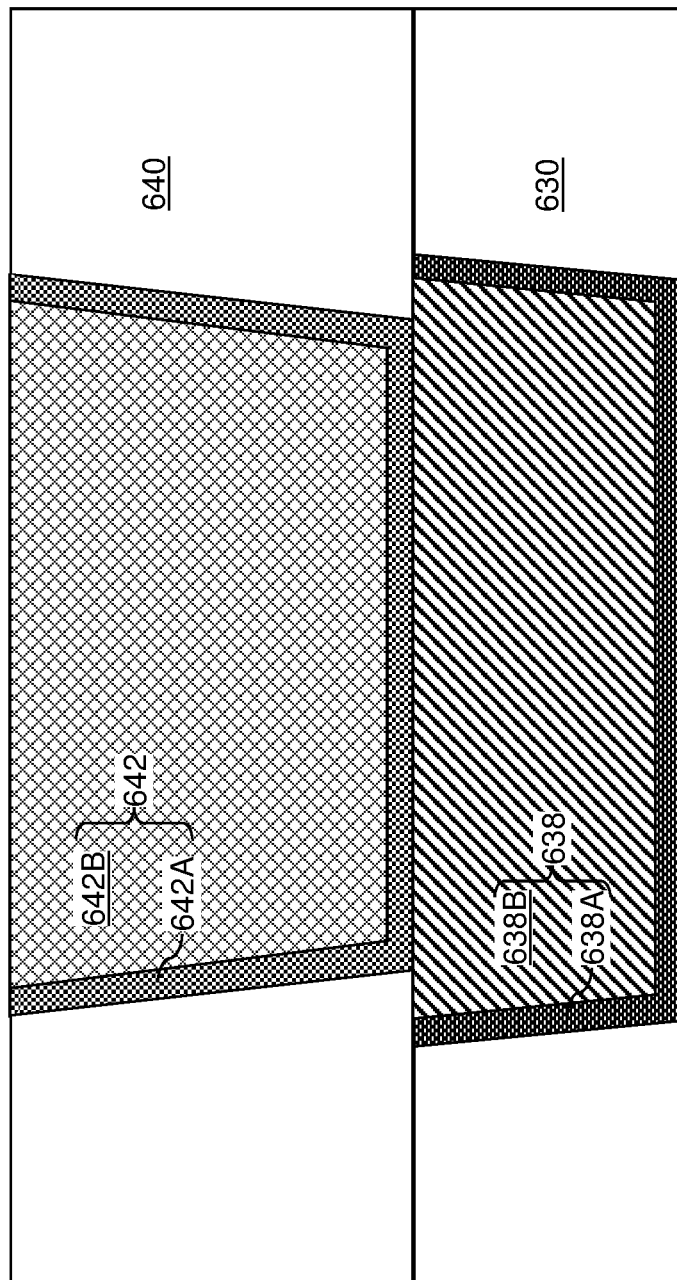

FIGS. 3A and 3B are sequential vertical cross-sectional views of a portion of the exemplary structure during formation of a metal interconnect structure in a second configuration according to an embodiment of the present disclosure.

Referring to FIG. 3A, the second configuration of the exemplary structure may be derived from the first configuration of the exemplary structure illustrated in FIG. 2B by increasing the thickness of the metallic fill material layer 42B. Specifically, the thickness of the metallic fill material layer 42B may be increased such that the bottommost portion of the top surface of the metallic fill material layer 42B is formed above, at, or slightly below, the horizontal plane including the top surface of the metallic-stack-based-interconnect-level dielectric material layer 640. The metallic capping material layer 42C may be subsequently deposited over the metallic fill material layer 42B. In some embodiments, the bottommost portion of the top surface of the metallic fill material layer 42B may be formed slightly below the horizontal plane including the top surface of the metallic-stack-based-interconnect-level dielectric material layer 640, an overpolish process may be subsequently employed to provide complete removal of the metallic capping material layer 42C.

Figure 3C:
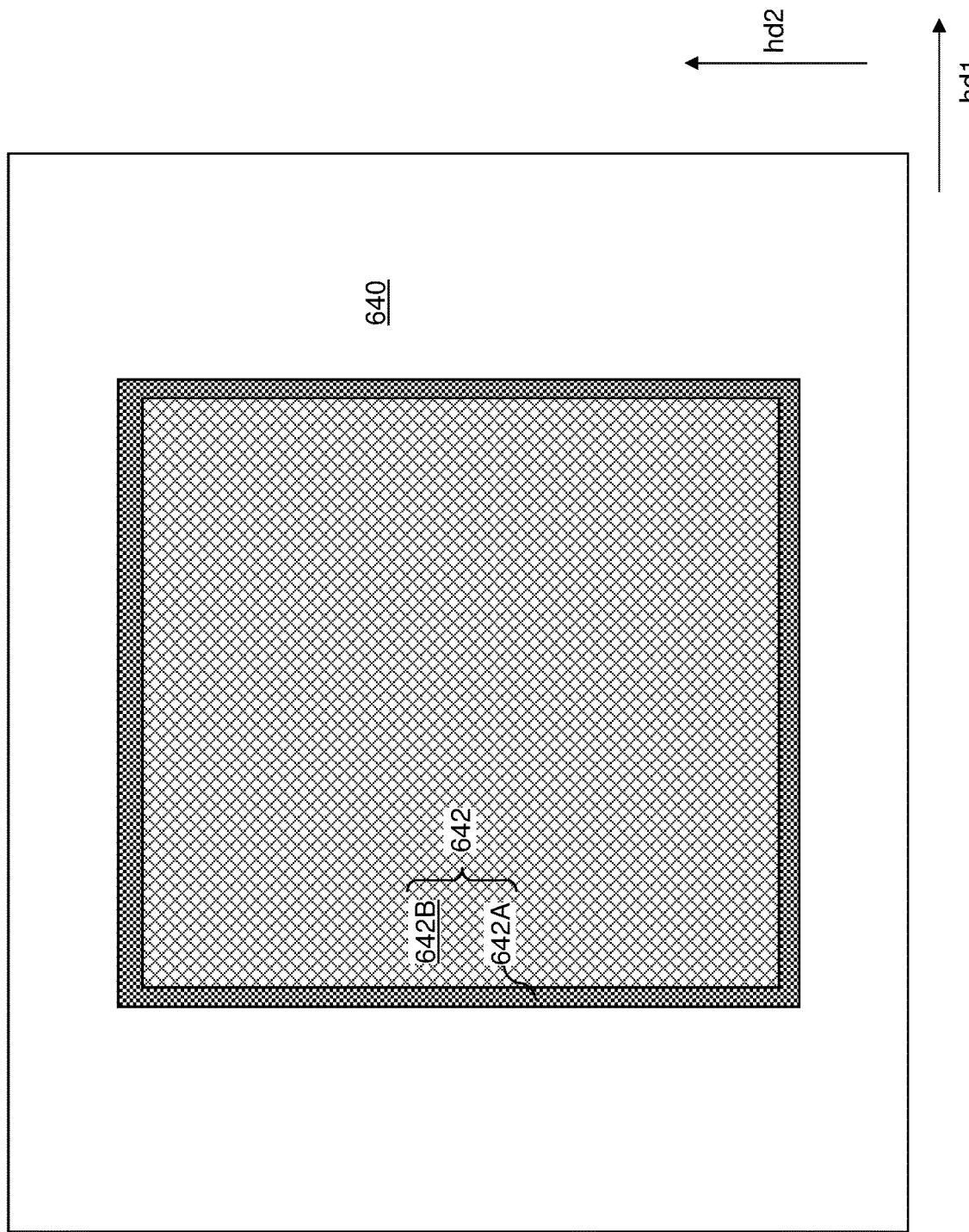
FIG. 3C is a top-down view of the portion of the exemplary structure illustrated in FIG. 3B.

FIG. 3C is a top-down view of the portion of the exemplary structure illustrated in FIG. 3B. Referring to FIGS. 3B and 3C, the processing steps of FIGS. 2C and 2D may be performed to remove portions of the layer stack (42A, 42B, 42C) that are located above the horizontal plane including the top surface of the metallic-stack-based-interconnect-level dielectric material layer 640. Since the entirety of the interface between the metallic fill material layer 42B and the metallic capping material layer 42C may be located above the horizontal plane including the top surface of the metallic-stack-based-interconnect-level dielectric material layer 640, the entirety of the metallic capping material layer 42C may be removed during the chemical mechanical polishing process as illustrated in FIGS. 3B and 3C.

According to an aspect of the present disclosure, the material of the metallic capping material layer 42C provides greater polishing resistance (i.e., a lower polish rate) than the material of the metallic fill material layer 42B. Deleterious embedding of slurries within the areas of the bottom portions of the metallic capping material layer 42C, i.e., within the areas of the cavities 49, may be reduced due to the presence of the metallic capping material layer 42C before a terminal step of the chemical mechanical polishing process. The top surface of the metallic fill material portion 642B may have a reduced surface roughness as compared to an exemplary chemical mechanical polishing process that does not use a metallic capping material layer 42C.

Figure 4A:
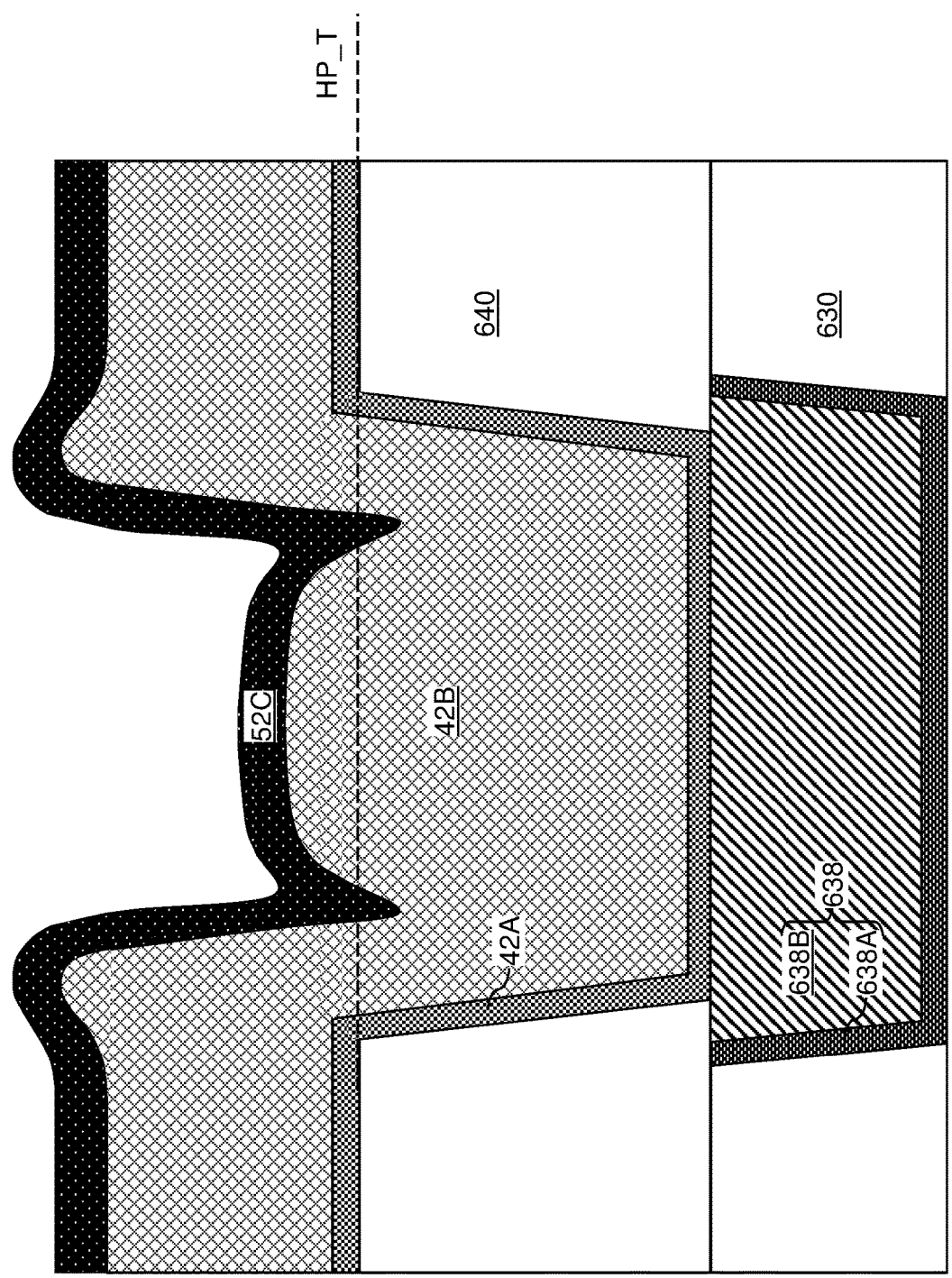
FIGS. 4A and 4B are sequential vertical cross-sectional views of a portion of the exemplary structure during formation of a metal interconnect structure in a third configuration according to an embodiment of the present disclosure.
Figure 4B:
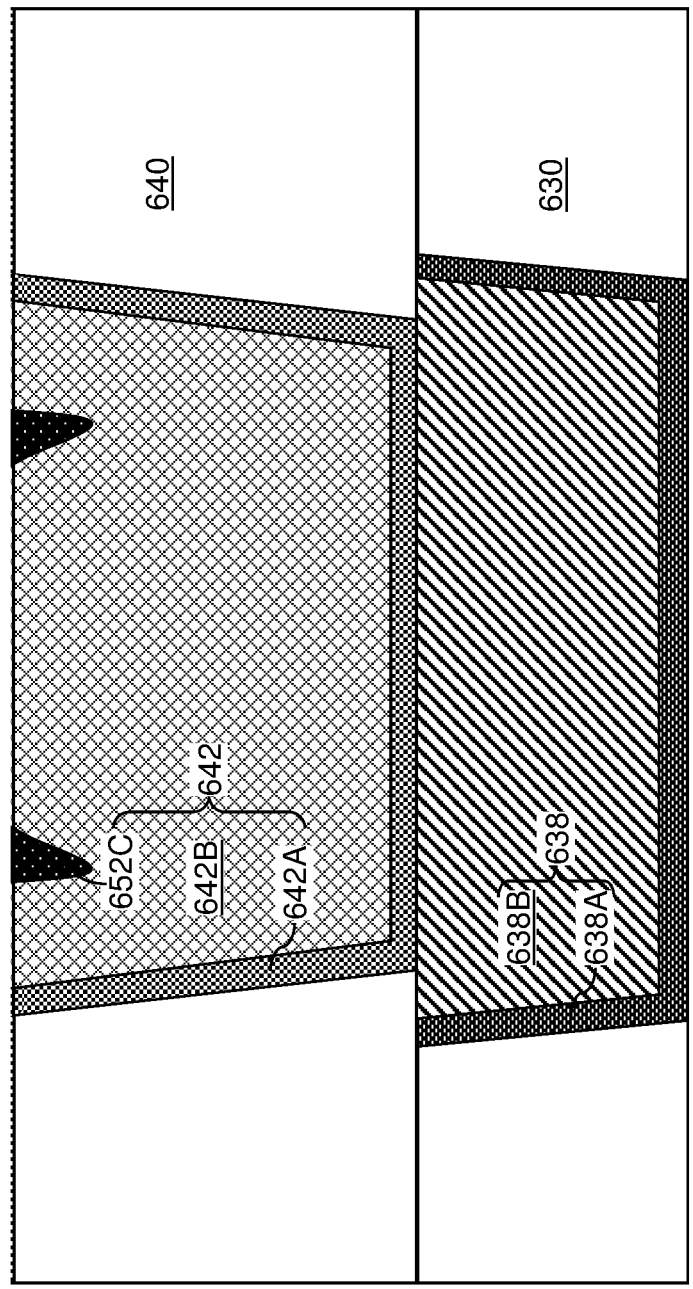

FIGS. 4A and 4B are sequential vertical cross-sectional views of a portion of the exemplary structure during formation of a metal interconnect structure in a third configuration according to an embodiment of the present disclosure.

Referring to FIG. 4A, the third configuration of the exemplary structure may be derived from the first configuration of the exemplary structure illustrated in FIG. 2B by replacing the metallic capping material layer 42C of the first configuration of the exemplary structure with a metallic capping material layer 52C comprising a conductive transition metal alloy or a transition metal such as Ti, Ta, or W. In one embodiment, the metallic capping material layer 52C may include a conductive metallic nitride material such as TiN, TaN, or WN, or a conductive metallic carbide material such as TiC, TaC, or WC, or a transition metal such as Ti, Ta, or W. In one embodiment, the metallic capping material layer 52C may have a higher Young's modulus than the material of the metallic fill material layer 42B. The metallic capping material layer 52C may be deposited by physical vapor deposition or chemical vapor deposition. The thickness of the metallic capping material layer 52C may be in a range from 5 nm to 100 nm, such as from 10 nm to 50 nm, although lesser and greater thicknesses may also be used.

In one embodiment, the duration of a physical vapor deposition process that deposits the metallic fill material layer 42B may be selected such that the lowest regions of the top surface of the metallic fill material layer 42B are formed below the horizontal plane including the top surface of the metallic-stack-based-interconnect-level dielectric material layer 640, while a region of the top surface of the metallic fill material layer 42B that overlies a center region of the cavity 49 is formed above the horizontal plane including the top surface of the metallic-stack-based-interconnect-level dielectric material layer 640. The thickness of the metallic capping material layer 52C may be selected such that the entirety of the top surface of the metallic capping material layer 52C is located above the horizontal plane including the top surface of the metallic-stack-based-interconnect-level dielectric material layer 640.

Figure 4C:
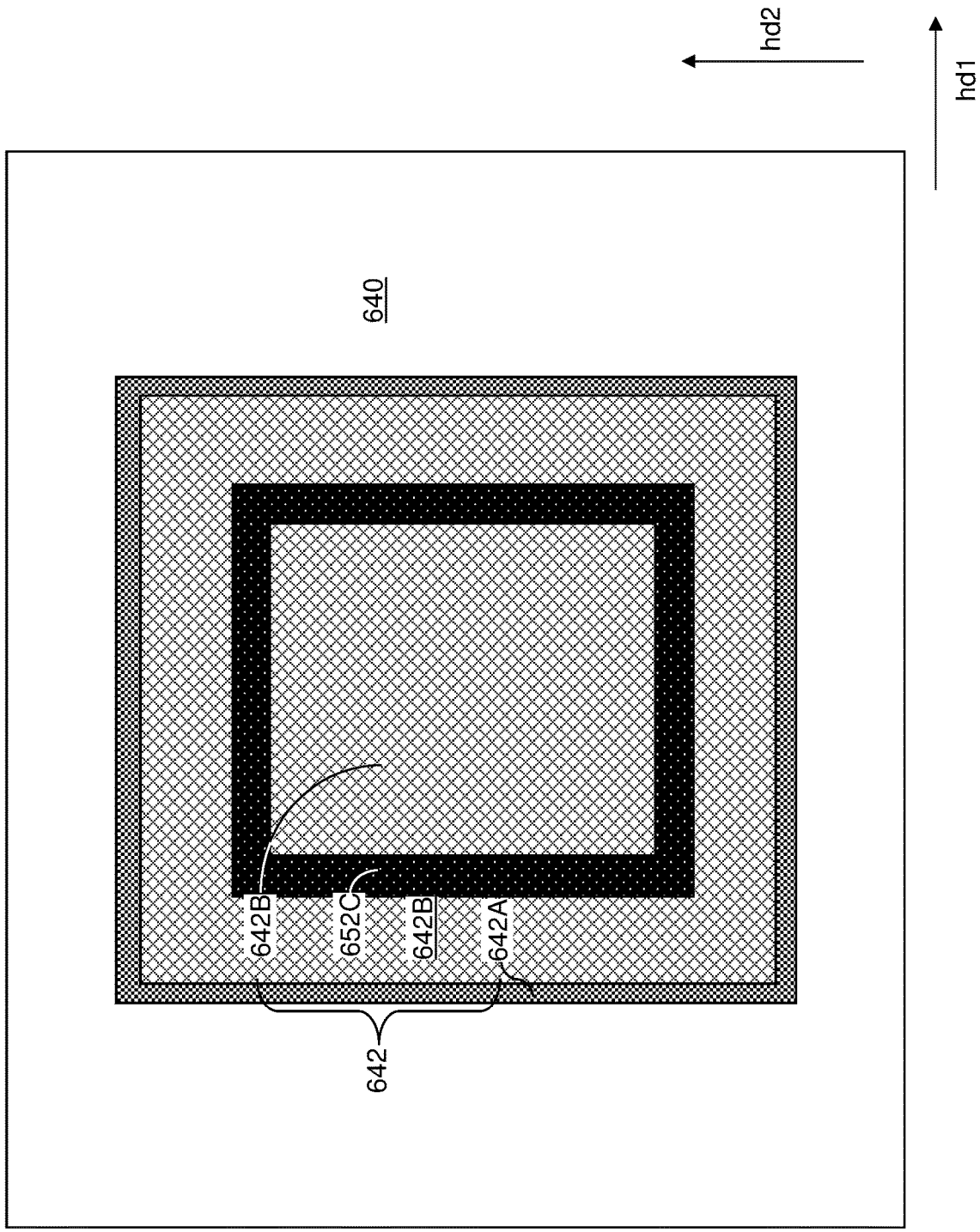
FIG. 4C is a top-down view of the portion of the exemplary structure illustrated in FIG. 4B.

FIG. 4C is a top-down view of the portion of the exemplary structure illustrated in FIG. 4B. Referring to FIGS. 4B and 4C, the processing steps of FIGS. 2C and 2D may be performed to remove portions of the layer stack (42A, 42B, 52C) that are located above the horizontal plane including the top surface of the metallic-stack-based-interconnect-level dielectric material layer 640.

According to an aspect of the present disclosure, the material of the metallic capping material layer 52C provides greater polishing resistance (i.e., a lower polish rate) than the material of the metallic fill material layer 42B. Thus, portions of the metallic capping material layer 52C located underneath the horizontal plane including the top surface of the metallic-stack-based-interconnect-level dielectric material layer 640 remain embedded within a respective remaining portion of the metallic fill material layer 42B. Each contiguous set of remaining material portions of the layer stack (42A, 42B, 52C) comprises a metal interconnect structure 642, in which the average atomic percentage of aluminum is at least 50%.

Each metal interconnect structure 642 may comprise a metallic barrier liner 642A, a metallic fill material portion 642B, and a metallic inlay structure 652C. The metallic barrier liner 642A is a patterned remaining portion of the metallic barrier liner layer 42A. The metallic fill material portion 642B is a patterned remaining portion of the metallic fill material layer 42B. The metallic inlay structure 652C is a patterned remaining portion of the metallic capping material layer 52C. The metallic inlayer structure 652C is embedded within the metallic fill material portion 642B, which is a remaining portion of the metallic fill material layer 42B.

The topmost surfaces of the metallic barrier liner 642A, the metallic fill material portion 642B, and the metallic inlay structure 652C may be formed within the horizontal plane including the top surface of the metallic-stack-based-interconnect-level dielectric material layer 640. In one embodiment, the metallic fill material portion 642B may comprise a contoured top surface that includes an outer surface portion that is physically exposed outside a closed outer periphery of the metallic inlay structure 652C, an inner surface portion that is physically exposed inside a closed inner periphery of the metallic inlay structure 652C, and a contoured connecting surface portion that contacts a contoured bottom surface of the metallic inlay structure 652C and connecting the outer surface portion and the inner surface portion. In one embodiment, ratio of the area of the top surface of the metallic capping material layer 652C to the area of the top surface of the metal interconnect structure 642 may be in a range from 0.01 to 0.3, such as from 0.02 to 0.2 and/or from 0.03 to 0.1.

The outer periphery of the top surface, and/or a horizontal cross-sectional shape, of each metal interconnect structure 642 may have a shape of a square, a rounded square, a rectangle, a rounded rectangle, or any two-dimensional curvilinear shape having a closed periphery. In one embodiment, the outer periphery of the top surface, and/or a horizontal cross-sectional shape, of each metal interconnect structure 642 may have a pair of first sides that are parallel to a first horizontal direction hd1 and a pair of second sides that are parallel to a second horizontal direction hd2. The pair of first sides may, or may not, be directly adjoined to the pair of second sides. The lateral dimension of each first side may be in a range from 300 nm to 60,000 nm, such as from 1,000 nm to 10,000 nm, although lesser and greater lateral dimensions may also be used.

An inner periphery of a top surface of the metallic barrier liner 642A may be laterally offset inward from an outer periphery of the top surface of the metallic barrier liner 642A. An outer periphery of the outer surface portion of the top surface of the metallic fill material portion 642B may coincide with the inner periphery of the top surface of the metallic barrier liner 642A. An inner periphery of the outer surface portion of the top surface of the metallic fill material portion 642B may be laterally offset inward from the outer periphery of the outer surface portion of the top surface of the metallic fill material portion 642B. An outer periphery of the contoured connecting surface portion of the top surface of the metallic fill material portion 642B may coincide with the inner periphery of the outer surface portion of the top surface of the metallic fill material portion 642B. An inner periphery of the contoured connecting surface portion of the top surface of the metallic fill material portion 642B may be laterally offset inward from the outer periphery of the contoured connecting surface portion of the top surface of the metallic fill material portion 642B. A periphery of the inner surface portion of the top surface of the metallic fill material portion 642B may coincide with the inner periphery of the contoured connecting surface portion of the top surface of the metallic fill material portion 642B.

In one embodiment, the interface between the metallic barrier liner 642A and the metallic fill material portion 642B has a closed periphery within the horizontal plane including the topmost surfaces of the metallic barrier liner 642A and the metallic fill material portion 642B. The metallic inlay structure 652C comprises a closed outer periphery within the horizontal plane including the topmost surfaces of the metallic barrier liner 642A and the metallic fill material portion 642B. In one embodiment, the metallic fill material portion 642B comprises aluminum at an atomic percentage, which may be greater than 90%.

According to an aspect of the present disclosure, a device structure may be provided, which comprises: a dielectric material layer (such as a metallic-stack-based-interconnect-level dielectric material layer 640) located over a substrate 9; and a metal interconnect structure 642 embedded in the dielectric material layer and comprising: a metallic barrier liner 642A comprising a conductive metallic material; a metallic fill material portion 642B located within the metallic barrier liner 642A having a first Young's modulus; and a metallic inlay structure 652C embedded within the metallic fill material portion 642B and having a second Young's modulus that is greater than the first Young's modulus, wherein the metallic inlay structure 652C has a top surface within a horizontal plane including topmost surfaces of the metallic barrier liner 642A and the metallic fill material portion 642B and is laterally spaced from an interface between the metallic barrier liner 642A and the metallic fill material portion 642B.

In one embodiment, the metallic fill material portion may include an aluminum-based metallic fill material portion that includes aluminum at a first atomic percentage greater than 90%; and the metallic inlay structure may be free of aluminum or includes aluminum at a second atomic percentage that is lower than the first atomic percentage.

In one embodiment, the aluminum-based metallic fill material portion may include an aluminum-copper alloy including copper at an atomic percentage greater than 0.2%.

In one embodiment, the interface between the metallic barrier liner 642A and the metallic fill material portion 642B has a closed periphery within the horizontal plane including the topmost surfaces of the metallic barrier liner 642A and the metallic fill material portion 642B; and the metallic inlay structure 652C comprises a closed outer periphery within the horizontal plane including the topmost surfaces of the metallic barrier liner 642A and the metallic fill material portion 642B.

In one embodiment, the closed outer periphery of the metallic inlay structure 652C is laterally spaced from the closed periphery of the interface between the metallic barrier liner 642A and the metallic fill material portion 642B by a uniform lateral spacing.

In one embodiment, the metallic inlay structure 652C comprises a closed inner periphery within the horizontal plane including the topmost surfaces of the metallic barrier liner 642A and the metallic fill material portion 642B; and the closed inner periphery is laterally spaced from the closed outer periphery by a uniform spacing throughout the closed inner periphery.

In one embodiment, the metallic inlay structure 652C has a vertical cross-sectional profile in which a width of the metallic inlay structure 652C decreases with a vertical distance downward from the horizontal plane including the topmost surfaces of the metallic barrier liner 642A and the metallic fill material portion 642B. The uniform spacing between the outer periphery of the top surface of the metallic inlay structure 652C and the inner periphery of the top surface of the metallic inlay structure 642 may be in a range from 2 nm to 200 nm, such as from 6 nm to 60 nm, although lesser and greater widths may also be used.

In one embodiment, a top surface of the metallic fill material portion 642B comprises: an outer surface portion located within the horizontal plane including the topmost surfaces of the metallic barrier liner 642A and the metallic fill material portion 642B and outside a closed outer periphery of the metallic inlay structure 652C; an inner surface portion located within the horizontal plane including the topmost surfaces of the metallic barrier liner 642A and the metallic fill material portion 642B and inside a closed inner periphery of the metallic inlay structure 652C; and a contoured connecting surface portion that contacts a contoured bottom surface of the metallic inlay structure 652C and connecting the outer surface portion and the inner surface portion.

In one embodiment, the metallic inlay structure 652C comprises, and/or consists essentially of, a material selected from TiN, TaN, WN, TiC, TaC, WC, Ti, Ta, and W. In one embodiment, the metallic barrier liner 642A comprises, and/or consists essentially of, a material selected from TiN, TaN, WN, Ti, Ta, and W.

In one embodiment, the metallic fill material portion 642B comprises, and/or consists essentially of, an aluminum-copper alloy including copper at an atomic percentage greater than 0.2%.

In one embodiment, the device structure comprises: an additional dielectric material layer (such as a third line-and-via-level dielectric material layer 630) located between the substrate 9 and the dielectric material layer (such as a metallic-stack-based-interconnect-level dielectric material layer 640); and a copper-based metal interconnect structure (such as a third metal line structure 638) comprising an additional metallic barrier liner 638A and a copper-based metallic fill material portion 638B embedded in the additional metallic barrier liner 638A and contacting a bottom surface of the metallic barrier liner 642A, wherein the copper-based metallic fill material portion 638B comprises copper at an atomic percentage greater than 50%, such as greater than 90% and/or greater than 98%.

Figure 5A:
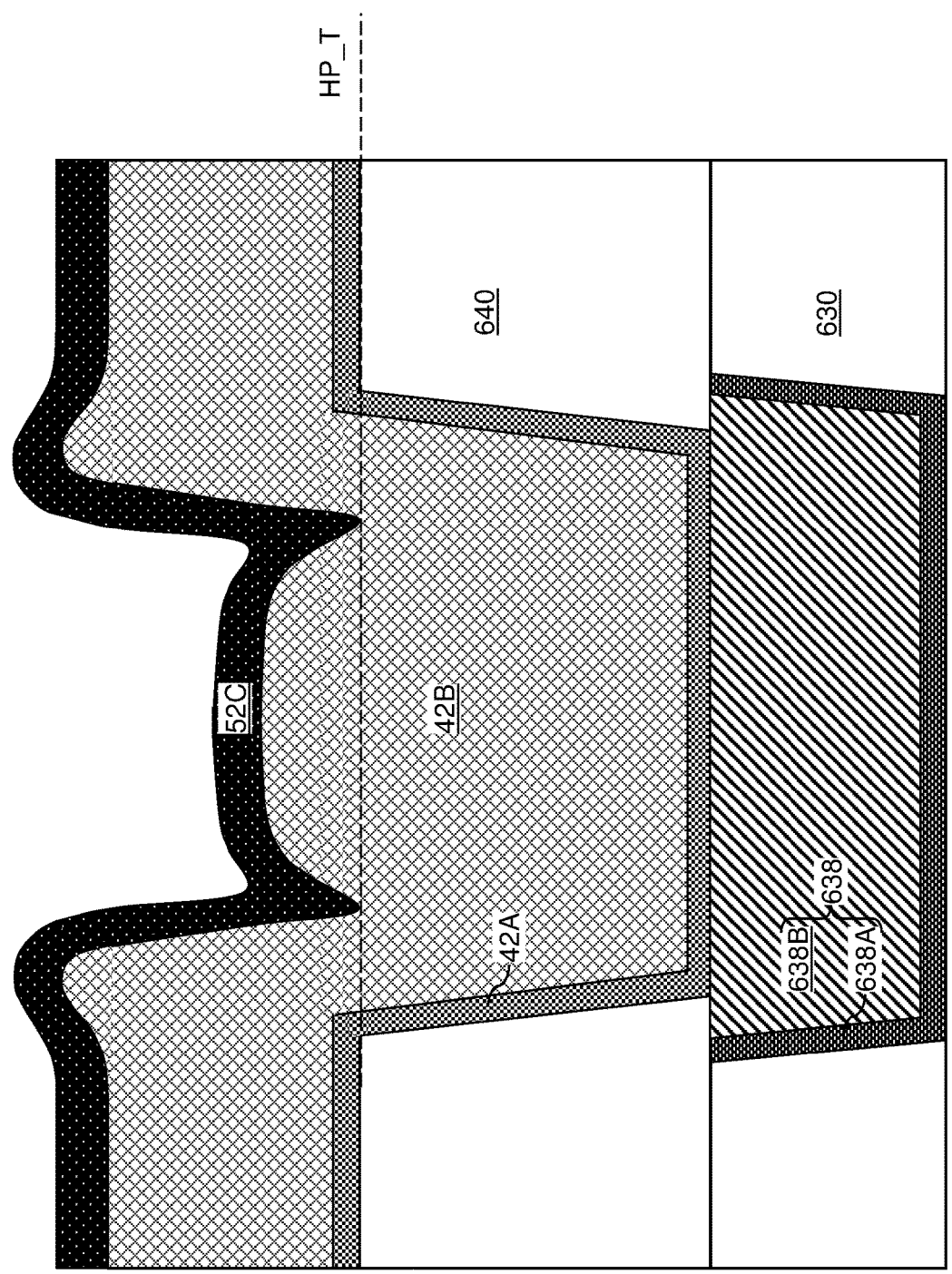
FIGS. 5A and 5B are sequential vertical cross-sectional views of a portion of the exemplary structure during formation of a metal interconnect structure in a third configuration according to an embodiment of the present disclosure.
Figure 5B:
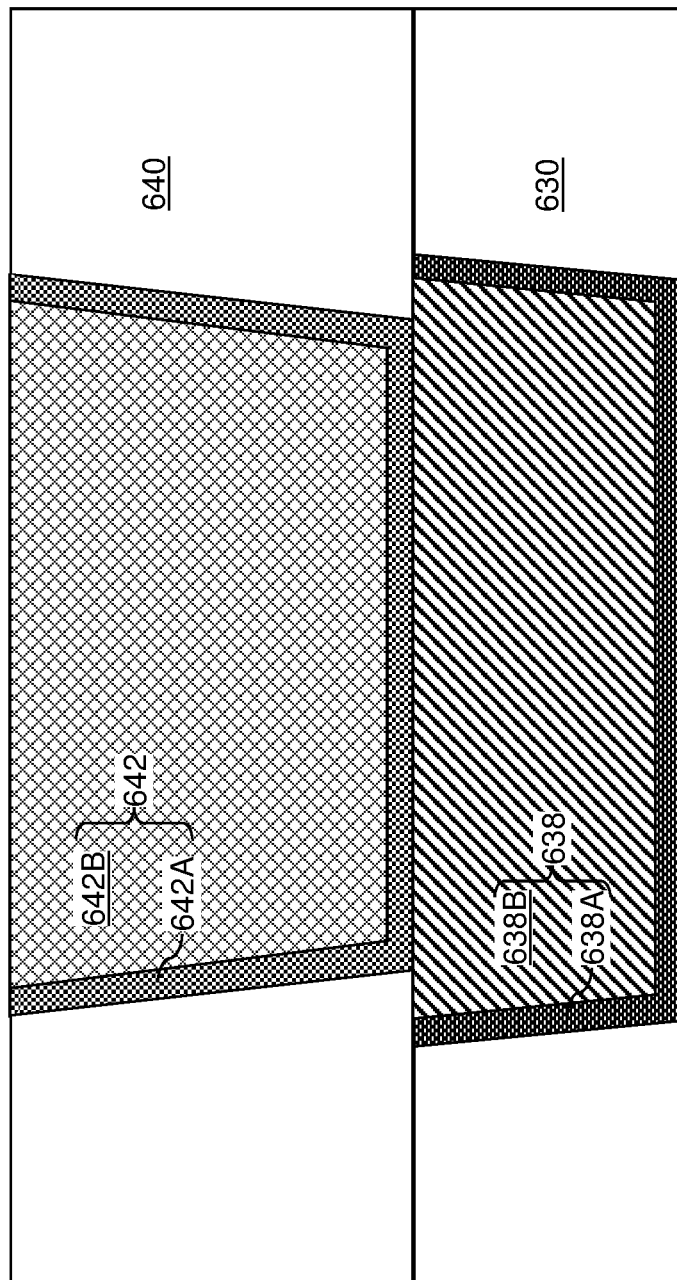

FIGS. 5A and 5B are sequential vertical cross-sectional views of a portion of the exemplary structure during formation of a metal interconnect structure in a third configuration according to an embodiment of the present disclosure.

Referring to FIG. 5A, the fourth configuration of the exemplary structure may be derived from the third configuration of the exemplary structure illustrated in FIG. 4A by increasing the thickness of the metallic fill material layer 42B. Specifically, the thickness of the metallic fill material layer 42B may be increased such that the bottommost portion of the top surface of the metallic fill material layer 42B is formed at, above, or slightly below, the horizontal plane including the top surface of the metallic-stack-based-interconnect-level dielectric material layer 640. The metallic capping material layer 52C is subsequently deposited over the metallic fill material layer 42B. In some embodiments, the bottommost portion of the top surface of the metallic fill material layer 42B may be formed below the horizontal plane including the top surface of the metallic-stack-based-interconnect-level dielectric material layer 640, an overpolish process may be subsequently employed to provide complete removal of the metallic capping material layer 52C.

Figure 5C:
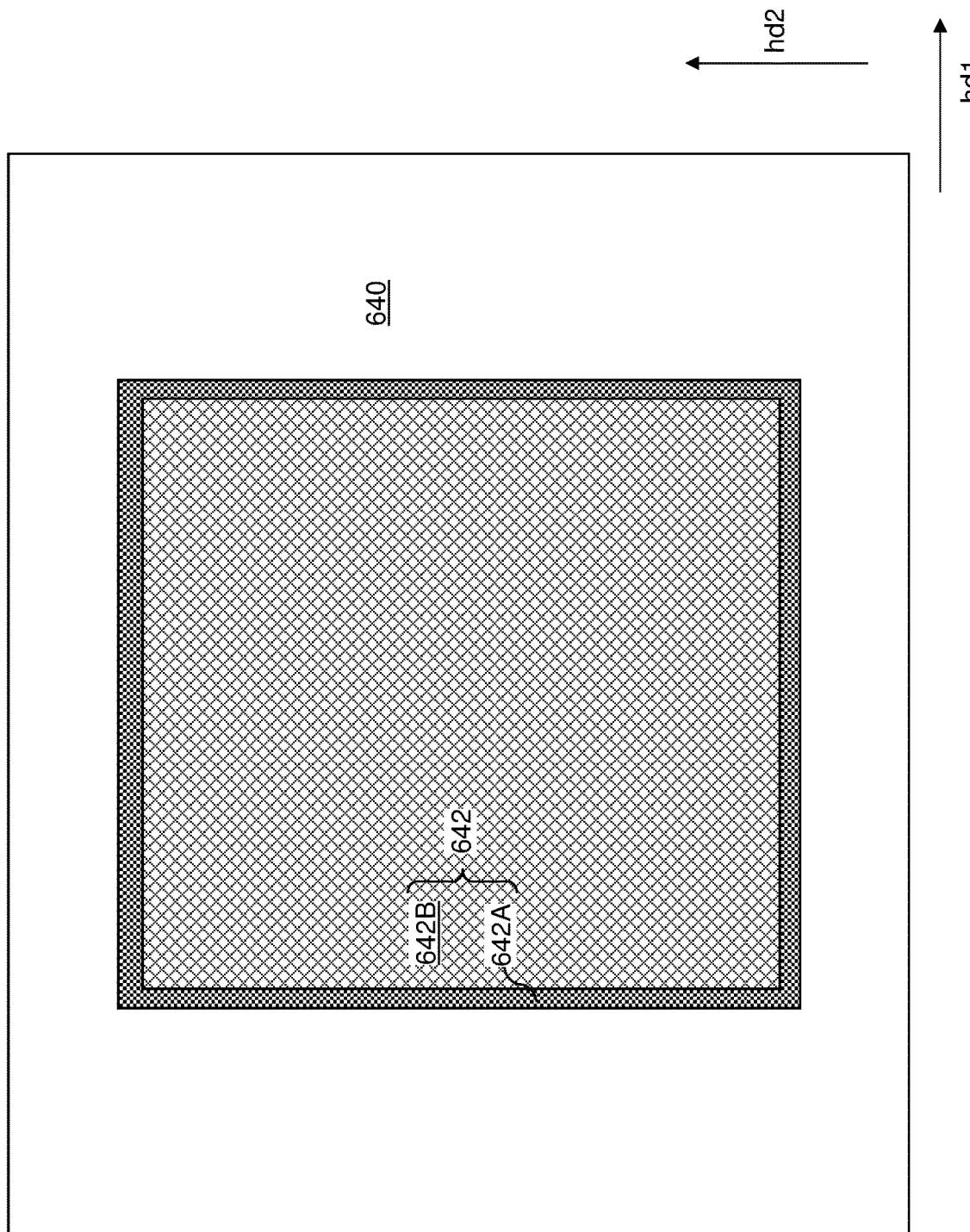
FIG. 5C is a top-down view of the portion of the exemplary structure illustrated in FIG. 5B.

FIG. 5C is a top-down view of the portion of the exemplary structure illustrated in FIG. 5B. Referring to FIGS. 5B and 5C, the processing steps of FIGS. 4B and 4C may be performed to remove portions of the layer stack (42A, 42B, 52C) that are located above the horizontal plane including the top surface of the metallic-stack-based-interconnect-level dielectric material layer 640. Since the entirety of the interface between the metallic fill material layer 42B and the metallic capping material layer 52C may be located above the horizontal plane including the top surface of the metallic-stack-based-interconnect-level dielectric material layer 640, the entirety of the metallic capping material layer 52C may be removed during the chemical mechanical polishing process.

According to an aspect of the present disclosure, the material of the metallic capping material layer 52C provides greater polishing resistance (i.e., a lower polish rate) than the material of the metallic fill material layer 42B. Deleterious embedding of slurries within the areas of the bottom portions of the metallic capping material layer 52C, i.e., within the areas of the cavities 49, is reduced due to the presence of the metallic capping material layer 52C before a terminal step of the chemical mechanical polishing process. The top surface of the metallic fill material portion 642B may have a reduced surface roughness compared to a comparative exemplary chemical mechanical polishing process that does not use a metallic capping material layer 52C.

Figure 6:
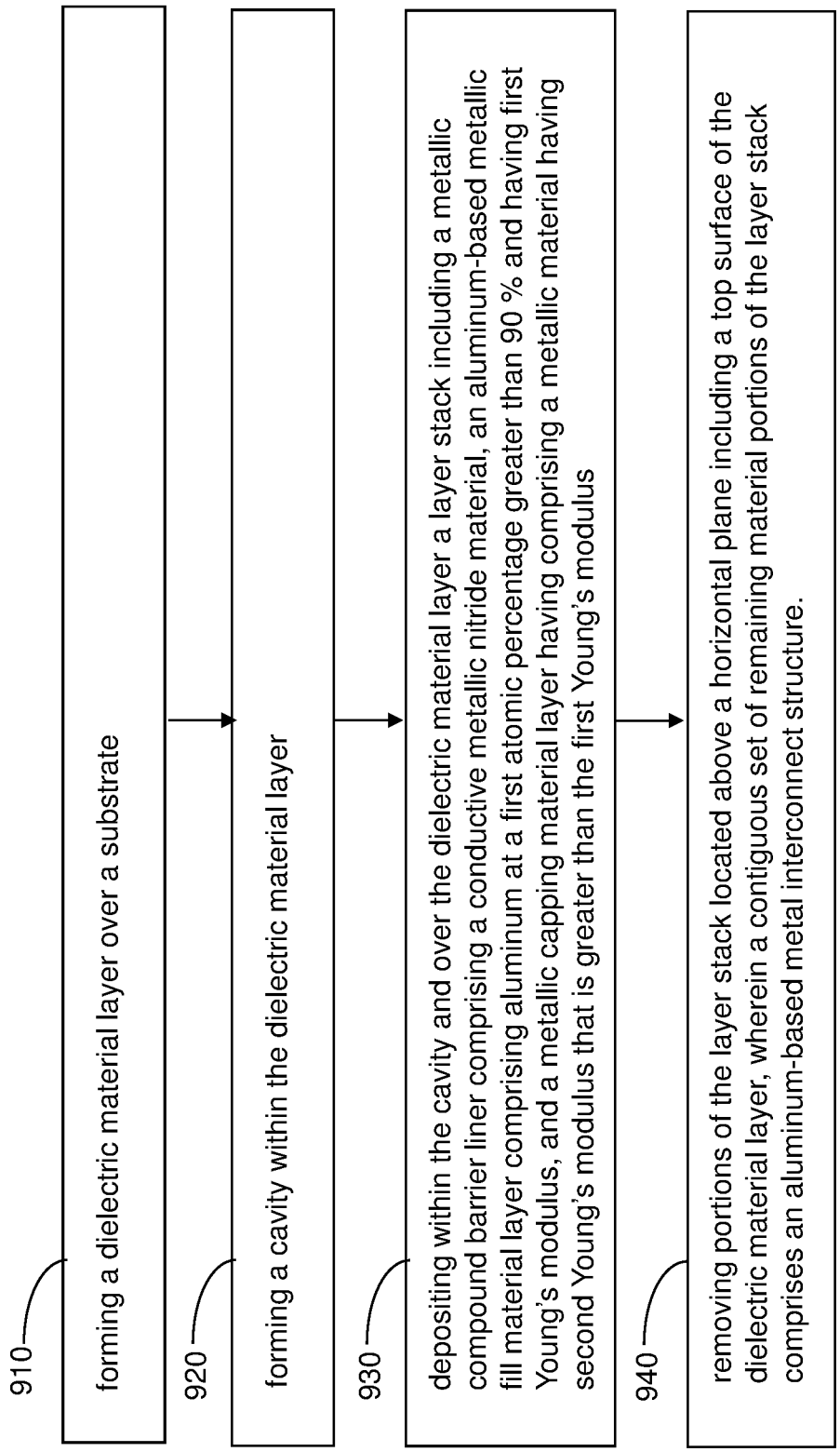
FIG. 6 is a flowchart that illustrates a sequence of processing steps for manufacturing a metal interconnect structure of the present disclosure.

FIG. 6 is a flowchart that illustrates a sequence of processing steps for a method of forming a metal interconnect structure of the present disclosure.

Referring to FIGS. 1, 2A, 3A, 4A, and 5A and step 910 of FIG. 6 of the present disclosure, a dielectric material layer (such as a metallic-stack-based-interconnect-level dielectric material layer 640) may be formed over a substrate 9.

Referring to FIGS. 1, 2A, 3A, 4A, and 5A and step 920 of FIG. 6 of the present disclosure, a cavity 49 may be formed within the dielectric material layer.

Referring to FIGS. 1, 2B, 3A, 4A, and 5A and step 930 of FIG. 6 of the present disclosure, a layer stack including a metallic barrier liner layer 42A comprising a conductive metallic nitride material, a metallic fill material layer 42B comprising aluminum at a first atomic percentage greater than 90% and having first Young's modulus, and a metallic capping material layer (42C or 52C) comprising a metallic material having second Young's modulus that is greater than the first Young's modulus may be deposited within the cavity 49 and over the dielectric material layer.

Referring to FIGS. 1, 2C and 2D, 3B and 3C, 4B and 4C, and 5B and 5C, and step 940 of FIG. 6 if the present disclosure, portions of the layer stack {42A, 42B, (42C or 52C)} located above a horizontal plane including a top surface of the dielectric material layer may be removed, for example, by performing a chemical mechanical polishing process. A contiguous set of remaining material portions of the layer stack {42A, 42B, (42C or 52C)} comprises a metal interconnect structure 642.

The metal interconnect structures 642 of the present disclosure may be free of pits caused by trapping of slurries in recessed surfaces of an aluminum-containing material layer during a chemical mechanical polishing process. As such, the metal interconnect structures 642 of the present disclosure may provide reduced surface roughness and enhanced reliability and durability during subsequent use of a device structure containing the metal interconnect structures 642. In some embodiments, the metal interconnect structures 642 may be used as bonding pads for attaching bonding wires.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device structure comprising:
a dielectric material layer located over a substrate; and
a metal interconnect structure embedded in the dielectric material layer and comprising:
  a metallic barrier liner comprising a conductive metallic material;
  a metallic fill material portion located within the metallic barrier liner and having a first Young's modulus; and
  a metallic inlay structure embedded within the metallic fill material portion and having a second Young's modulus that is greater than the first Young's modulus, wherein the metallic inlay structure has a top surface within a horizontal plane including topmost surfaces of the metallic barrier liner and the metallic fill material portion and is laterally spaced from an interface between the metallic barrier liner and the metallic fill material portion,
wherein:
the metallic fill material portion comprises an aluminum-based metallic fill material portion that includes aluminum at a first atomic percentage; and
the metallic inlay structure is free of aluminum or includes aluminum at a second atomic percentage that is lower than the first atomic percentage.

2. The device structure of claim 1, wherein the first atomic percentage is greater than 90%.

3. The device structure of claim 2, wherein the aluminum-based metallic fill material portion comprises an aluminum-copper alloy including copper at an atomic percentage greater than 0.2%.

4. The device structure of claim 1, wherein:
the interface between the metallic barrier liner and the metallic fill material portion has a closed periphery within the horizontal plane including the topmost surfaces of the metallic barrier liner and the metallic fill material portion; and
the metallic inlay structure comprises a closed outer periphery within the horizontal plane including the topmost surfaces of the metallic barrier liner and the metallic fill material portion.

5. The device structure of claim 4, wherein the closed outer periphery of the metallic inlay structure is laterally spaced from the closed periphery of the interface between the metallic barrier liner and the metallic fill material portion.

6. The device structure of claim 4, wherein:
the metallic inlay structure comprises a closed inner periphery within the horizontal plane including the topmost surfaces of the metallic barrier liner and the metallic fill material portion; and
the closed inner periphery is laterally spaced from the closed outer periphery.

7. The device structure of claim 1, wherein the metallic inlay structure has a vertical cross-sectional profile in which a width of the metallic inlay structure decreases with a vertical distance downward from the horizontal plane including the topmost surfaces of the metallic barrier liner and the metallic fill material portion.

8. The device structure of claim 1, wherein a top surface of the metallic fill material portion comprises:
an outer surface portion located within the horizontal plane including the topmost surfaces of the metallic barrier liner and the metallic fill material portion and outside a closed outer periphery of the metallic inlay structure;
an inner surface portion located within the horizontal plane including the topmost surfaces of the metallic barrier liner and the metallic fill material portion and inside a closed inner periphery of the metallic inlay structure; and
a contoured connecting surface portion that contacts a contoured bottom surface of the metallic inlay structure and connecting the outer surface portion and the inner surface portion.

9. The device structure of claim 1, wherein the metallic inlay structure comprises a material selected from TiN, TaN, WN, TiC, TaC, WC, Ti, Ta, and W.

10. The device structure of claim 1, further comprising:
an additional dielectric material layer located between the substrate and the dielectric material layer; and
a copper-based metal interconnect structure comprising an additional metallic barrier liner and a copper-based metallic fill material portion embedded in the additional metallic barrier liner and contacting a bottom surface of the metallic barrier liner, wherein the copper-based metallic fill material portion comprises copper at an atomic percentage greater than 50%.

11. A device structure comprising:
a dielectric material layer located over a substrate; and
an aluminum-based metal interconnect structure embedded in the dielectric material layer and comprising:
a metallic barrier liner comprising a conductive metallic material;
an aluminum-based metallic fill material portion located within the metallic barrier liner and comprising aluminum at a first atomic percentage greater than 90%; and
a metallic inlay structure embedded within the aluminum-based metallic fill material portion and comprising an aluminum-containing alloy including aluminum at a second atomic percentage that is less than the first atomic percentage and including a non-aluminum element at an atomic percentage greater than 0.1%, wherein the metallic inlay structure has a top surface within a horizontal plane including topmost surfaces of the metallic barrier liner and the aluminum-based metallic fill material portion and is laterally spaced from an interface between the metallic barrier liner and the aluminum-based metallic fill material portion.

12. The device structure of claim 11, wherein the metallic inlay structure has a greater value for Young's modulus than the aluminum-based metallic fill material portion.

13. The device structure of claim 11, wherein the non-aluminum element comprises at least one element selected from Cu, Mn, Si, Mg, Zn, B, Ti, Cr, Fe, Co, Ni, Mo, Ag, Ta, W, Re, Ir, Pt, and Au.

14. The device structure of claim 11, wherein:
the interface between the metallic barrier liner and the aluminum-based metallic fill material portion has a closed periphery within the horizontal plane including the topmost surfaces of the metallic barrier liner and the aluminum-based metallic fill material portion; and
the metallic inlay structure comprises a closed outer periphery within the horizontal plane including the topmost surfaces of the metallic barrier liner and the aluminum-based metallic fill material portion.

15. The device structure of claim 11, wherein a top surface of the aluminum-based metallic fill material portion comprises:
an outer surface portion located within the horizontal plane including the topmost surfaces of the metallic barrier liner and the aluminum-based metallic fill material portion and outside a closed outer periphery of the metallic inlay structure;
an inner surface portion located within the horizontal plane including the topmost surfaces of the metallic barrier liner and the aluminum-based metallic fill material portion and inside a closed inner periphery of the metallic inlay structure; and
a contoured connecting surface portion that contacts a contoured bottom surface of the metallic inlay structure and connecting the outer surface portion and the inner surface portion.

16. A method of forming a device structure, comprising:
forming a dielectric material layer over a substrate;
forming a cavity within the dielectric material layer;
depositing within the cavity and over the dielectric material layer a layer stack including a metallic barrier liner layer, a metallic fill material layer having first Young's modulus, and a metallic capping material layer comprising a metallic material having second Young's modulus that is greater than the first Young's modulus; and
removing portions of the layer stack located above a horizontal plane including a top surface of the dielectric material layer, wherein a contiguous set of remaining material portions of the layer stack comprises a metal interconnect structure, wherein:
the metallic fill material layer comprises aluminum at a first atomic percentage; and
the metallic capping material layer is free of aluminum or comprises aluminum at a second atomic percentage that is lower than the first atomic percentage.

17. The method of claim 16, wherein the first atomic percentage is greater than 90%.

18. The method of claim 16, wherein the metallic material of the metallic capping material layer comprises a material selected from TiN, TaN, WN, TiC, TaC, WC, Ti, Ta, and W.

19. The method of claim 16, wherein a remaining portion of the metallic capping material layer within the metal interconnect structure comprises a metallic inlay structure embedded within a remaining portion of the metallic fill material layer.

20. The method of claim 19, wherein a remaining portion of the metallic fill material layer within the metal interconnect structure comprises a top surface that includes:
- an outer surface portion that is physically exposed outside a closed outer periphery of the metallic inlay structure;
- an inner surface portion that is physically exposed inside a closed inner periphery of the metallic inlay structure; and
- a contoured connecting surface portion that contacts a contoured bottom surface of the metallic inlay structure and connecting the outer surface portion and the inner surface portion.

* * * * *